United States Patent
Song et al.

(10) Patent No.: US 10,203,951 B2
(45) Date of Patent: Feb. 12, 2019

(54) METHOD AND TERMINAL FOR OTA UPDATING

(71) Applicant: ZTE CORPORATION, Shenzhen (CN)

(72) Inventors: Shenyang Song, Shenzhen (CN); Dan Shuang, Shenzhen (CN)

(73) Assignee: XI'AN ZHONGXING NEW SOFTWARE CO., LTD, Shaanxi (CN)

( * ) Notice: Subject to any disclaimer, the term of this patent is extended or adjusted under 35 U.S.C. 154(b) by 26 days.

(21) Appl. No.: 15/501,925

(22) PCT Filed: Sep. 18, 2014

(86) PCT No.: PCT/CN2014/086870
§ 371 (c)(1),
(2) Date: Jun. 15, 2017

(87) PCT Pub. No.: WO2015/154385
PCT Pub. Date: Oct. 15, 2015

(65) Prior Publication Data
US 2017/0315800 A1   Nov. 2, 2017

(30) Foreign Application Priority Data
Aug. 6, 2014  (CN) .......................... 2014 1 0382256

(51) Int. Cl.
*G06F 9/445*  (2018.01)
*G06F 8/658*  (2018.01)
(Continued)

(52) U.S. Cl.
CPC .............. *G06F 8/658* (2018.02); *G06F 3/064* (2013.01); *G06F 3/067* (2013.01); *G06F 3/0619* (2013.01); *G06F 3/0659* (2013.01); *G11C 16/105* (2013.01)

(58) Field of Classification Search
CPC ............................................... G06F 8/30–8/78
See application file for complete search history.

(56) References Cited

U.S. PATENT DOCUMENTS 6,233,589 B1    5/2001  Balcha et al.
7,480,907 B1 *  1/2009  Marolia .................... G06F 8/65
                                                          717/127
(Continued)

FOREIGN PATENT DOCUMENTS

CN        101695162        4/2010
CN        102163155        8/2011
(Continued)

OTHER PUBLICATIONS

Kiyohara, Ryozo et al. "A New Method of Fast Compression of Program Code for OTA Updates in Consumer Devices," pp. 812-817. (Year: 2009).*
(Continued)

*Primary Examiner* — Benjamin C Wu
*Assistant Examiner* — Christopher J Franco
(74) *Attorney, Agent, or Firm* — Plumsea Law Group, LLC (57) ABSTRACT

A method and terminal for OTA upgrading are described. In the method, a system image file of a terminal to be upgraded is saved in the form of data blocks. The method includes: acquiring and parsing an OTA upgrade package to obtain respective differential upgrade files for the system image file; reading data blocks corresponding to respective differential upgrade files in the system image file, and performing an upgrading operation on corresponding data blocks to upgrade the system image file. Split system image files are used rather than files in a file system as data for differential comparison. Thus metadata in the file system are also included in differential data packet. After the upgrading, the image in the terminal is fully consistent with the image in a
(Continued)

Acquire and parse an OTA upgrade package to obtain respective differential upgrade files for the system image file — S101

Read data blocks corresponding to the respective differential upgrade files in the system image file, and perform an updating operation on the corresponding data blocks to achieve an upgrading of the system image file — S102 production process and does not conflict with a system check mechanism.

12 Claims, 4 Drawing Sheets

(51) Int. Cl.
  *G06F 3/06* (2006.01)
  *G11C 16/10* (2006.01)

(56) References Cited

U.S. PATENT DOCUMENTS

| | | | |
|---|---|---|---|
| 9,116,774 B2* | 8/2015 | Rajagopalan | G06F 8/654 |
| 9,369,867 B2* | 6/2016 | Prakash | H04W 12/06 |
| 2002/0034105 A1 | 3/2002 | Kulkarni et al. | |
| 2004/0215755 A1* | 10/2004 | O'Neill | G06F 8/654 |
| | | | 709/223 |
| 2007/0294686 A1* | 12/2007 | Oh | G06F 8/658 |
| | | | 717/168 |
| 2011/0004871 A1* | 1/2011 | Liu | G06F 8/65 |
| | | | 717/173 |
| 2014/0004825 A1* | 1/2014 | Prakash | H04W 12/06 |
| | | | 455/411 |
| 2014/0344797 A1* | 11/2014 | Rajagopalan | G06F 8/654 |
| | | | 717/169 |

FOREIGN PATENT DOCUMENTS

| | | |
|---|---|---|
| CN | 102346673 | 2/2012 |
| CN | 102693145 | 9/2012 |
| WO | 2004031961 | 4/2004 |
| WO | 2006052897 | 5/2006 |

OTHER PUBLICATIONS

Kiyohara, R. et al. "New Method for Software Updating in Mobile Phones," pp. 1-9. (Year: 2010).*
Ling, Yin et al., "A reprogamming protocol based on state machine for wireless sensor network," pp. 232-235. (Year: 2010).*
Jeyalakshmi, Dr. V. et al., "Secured Reconfigurable Software Defined Radio using OTA software download," pp. 1276-1280. (Year: 2012).*
Maia, Guilherme et al., "Improving an Over-the-Air Programming Protocol for Wireless Sensor Networks Based on Small World Concepts," pp. 261-267. (Year: 2009).*
Shiba, Hiroyuki et al., "Design and Evaluation of Software Radio Prototype with Over-the-Air Download Function," pp. 2466-2469. (Year: 2001).*
Extended European Search Report for European Application No. EP 14889157.5, Completed by the European Patent Office, dated Jul. 14, 2017, 8 Pages.
International Search Report for PCT/CN2014/086870, English Translation attached to original, Both completed by the Chinese Patent Office on May 4, 2015 All together 5 Pages.

* cited by examiner

FIG. 1

Prior Art

METHOD AND TERMINAL FOR OTA UPDATING

CROSS-REFERENCE TO RELATED APPLICATION

This application is the U.S. national phase of PCT Application No. PCT/CN2014/086870 filed Sep. 18, 2014, which claims priority to Chinese Application No. 201410382256.3 filed Aug. 6, 2014, the disclosures of which are incorporated in their entirety by reference herein.

TECHNICAL FIELD

The present disclosure relates to the field of communication technologies, and more particularly, to a method and terminal for over-the-air OTA upgrading.

BACKGROUND

Figure 1:
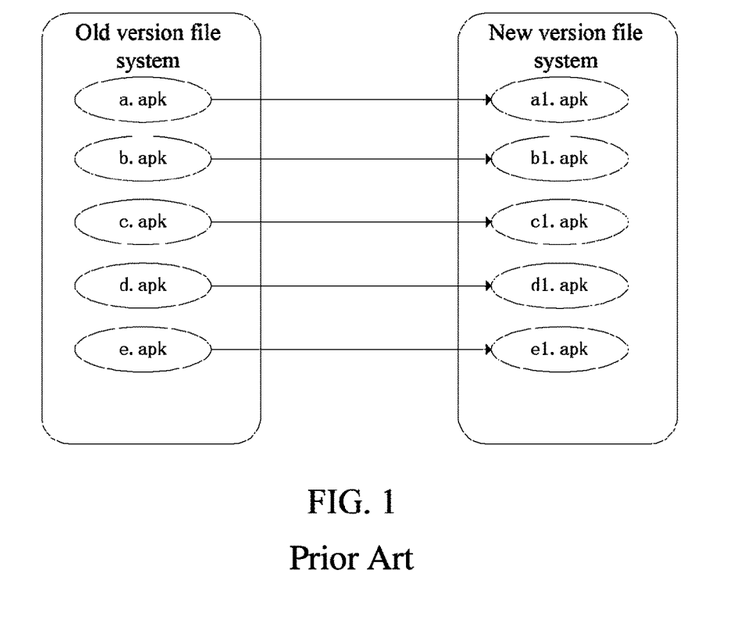
FIG. 1 is a schematic diagram of an OTA upgrading mechanism in an Android platform in the related art.

With more and more popularity of smart phones, people's requirements for smart phones are also more and more high, and especially the information security of mobile phones is paid much more attention. System developers and equipment manufacturers are also trying to strengthen the security of phones from various aspects. Google, the developer of Android smart phone system, introduced the system image integrity check function in the latest version, and that function ensures that the phone is not maliciously tampered by attackers through the way that integrity check is performed on the system image at each boot, but the mechanism is not compatible with the OTA upgrading mechanism widely used in the current Android system. Specifically, the OTA upgrading mechanism currently widely used in the Android smart platform is shown in FIG. 1. The upgrading way calculates corresponding differential data by comparing differences in corresponding files in the system in the production process, and packages the data into an OTA upgrading package; and then upgrades the corresponding files in the system to the new version through the upgrading package in the mobile phone side, to achieve the purpose of upgrading the entire system.

The problem of the mechanism, however, is that, although the contents of the upgraded system files are consistent with the new version, the modification order and manner differ for respective specific files in the upgrading process, resulting in that, in a system-level perspective, metadata in the file system has been modified. As a result, when that way works together with the Android system integrity check, it will lead to the failure of the system image check after the upgrading. Therefore, how to achieve the OTA upgrading and also to be compatible with the system image check mechanism has become a technical problem that needs to be solved urgently.

SUMMARY

Embodiments of the present disclosure provide a method and terminal for OTA upgrading to solve at least the problem that the OTA upgrading technology in the related art cannot be compatible with the system image check mechanism.

In accordance with one aspect of the present disclosure, a method for OTA upgrading is provided. In the method, a system image file of a terminal to be upgraded is saved in a form of data blocks. In particular, the method includes:

acquiring and parsing an OTA upgrade package to obtain respective differential upgrade files for the system image file;

reading data blocks corresponding to the respective differential upgrade files in the system image file, and performing an upgrading operation on the corresponding data blocks to achieve an upgrading of the system image file.

In an exemplary embodiment, in the method of the present disclosure, a file header of a differential upgrade file includes an Offset field for indicating an offset of a data block corresponding to the differential upgrade file in the system image file, as well as a Size field for indicating a size of the data block;

said reading data blocks corresponding to the respective differential upgrade files in the system image file specifically includes:

reading the data blocks corresponding to the respective differential upgrade files in the system image file according to Offset fields and Size fields in file headers of the respective differential upgrade files.

In an exemplary embodiment, in the method of the present disclosure, the file header of a differential upgrade file further includes a magic string field for judging whether the differential upgrade file is valid.

The method further includes: checking validities of the respective differential upgrade files according to magic string fields of the respective differential upgrade files when the respective differential upgrade files for the system image file are obtained, and triggering an operation of reading the corresponding data blocks when the respective differential upgrade files are valid.

In an exemplary embodiment, in the method of the present disclosure, said performing an upgrading operation on the corresponding data blocks to achieve an upgrading of the system image file specifically includes:

reading the data blocks corresponding to the respective differential upgrade files into a memory;

for the respective data blocks in the memory, applying patches of the respective differential upgrade files to the corresponding data blocks;

writing the upgraded data blocks into the terminal device to be upgraded to achieve the upgrading of the system image file.

In an exemplary embodiment, in the method of the present disclosure, said reading the data blocks corresponding to the respective differential upgrade files in the system image file and performing an upgrading operation on the corresponding data blocks specifically includes:

calling a system function to create respectively a processing process for each differential upgrade file, and each processing process calling a corresponding differential upgrade file, and reading a data block corresponding to the differential upgrade file in the system image file to perform an upgrading operation, to achieve a concurrent upgrading of the respective data blocks to be upgraded.

According to another aspect of the present disclosure, a terminal for OAT upgrading is provided, and a system image file in the terminal is saved in a form of data blocks. The terminal specifically includes an information acquiring module and an upgrading module.

The information acquiring module is arranged to acquire and parse an OTA upgrade package to obtain respective differential upgrade files for the system image file.

The upgrading module is arranged to read data blocks corresponding to the respective differential updating files in the system image file and perform an upgrading operation on the corresponding data blocks to achieve an upgrading of the system image file.

In an exemplary embodiment, in the terminal of the present disclosure, a file header of a differential upgrade file includes an Offset field for indicating an offset of a data block corresponding to the differential upgrade file in the system image file, and a Size field for indicating a size of the data block.

The upgrading module is arranged to read the data blocks corresponding to the respective differential upgrade files in the system image file according to Offset fields and Size fields in file headers of the respective differential upgrade files.

In an exemplary embodiment, in the terminal of the present disclosure, the file header of a differential upgrade file further includes a magic string field for judging whether the differential upgrade file is valid.

The information acquiring module is further arranged to check validities of the respective differential upgrade files according to magic string fields of the respective differential upgrade files when obtaining the respective differential upgrade files for the system image file, and trigger the upgrading module when the respective differential upgrade files are valid.

In an exemplary embodiment, in the terminal of the present disclosure, the upgrading module is arranged to read the data blocks corresponding to the respective differential upgrade files into a memory, and for the respective data blocks in the memory, apply patches of the respective differential upgrade files to the corresponding data blocks in the memory, and write the upgraded data blocks into the terminal device to achieve the upgrading of the system image file.

In an exemplary embodiment, in the terminal according to the present disclosure, the upgrading module is further arranged to call a system function to create respectively a processing process for each differential upgrade file, and use each processing process to call a corresponding differential upgrade file, and read a data block corresponding to the corresponding differential upgrade file in the system image file to perform an upgrading operation, to achieve a concurrent upgrading of the respective data blocks to be upgraded.

The present disclosure has the beneficial effects as follows:

Firstly, the present disclosure uses split system image files rather than files in the file system as data for differential comparison, so that metadata in the file system are also included in the differential data packet, and the upgrading process does not modify the metadata in the file system, and after the upgrading, the image in the terminal is completely consistent with the image in the production process and does not conflict with the system check mechanism. Therefore, an effective combination of the OTA upgrading mechanism with the system image check mechanism is achieved.

Secondly, the OTA upgrading used in the present disclosure can realize a concurrent upgrading of the system image, which significantly improves the upgrading efficiency.

DESCRIPTION OF THE DRAWINGS

To illustrate embodiments of the present disclosure or technical solutions in the related art more clearly, the accompanying drawings which are needed in descriptions of the embodiments or the related art will be briefly described below. It is apparent that the accompanying drawings described below are only certain embodiments of the present disclosure, and other drawings may be obtained by those skilled in the art according to the accompanying drawings without inventive work.

DETAILED DESCRIPTION

Hereinafter, in conjunction with the accompanying drawings in the embodiments of the present disclosure, technical solutions in the embodiments of the present disclosure will be described clearly and thoroughly. It is apparent that the embodiments described herein are only part of embodiments of the present disclosure, rather than all of them. Based on the embodiments of the present disclosure, all other embodiments obtained by those skilled in the art without any creative work are within the protection scope of the present disclosure.

To solve the problem that the OTA upgrading technology in the related art cannot be compatible with the system image check mechanism, the present disclosure provides a method and terminal for OTA upgrading. The method is an effective and feasible Android platform OTA upgrading method for block devices, which can make the OTA upgrading mechanism in the Android system work effectively together with the system check mechanism. The detailed implementation process of the present disclosure will now be described through several specific embodiments below.

First Embodiment

Figure 2:
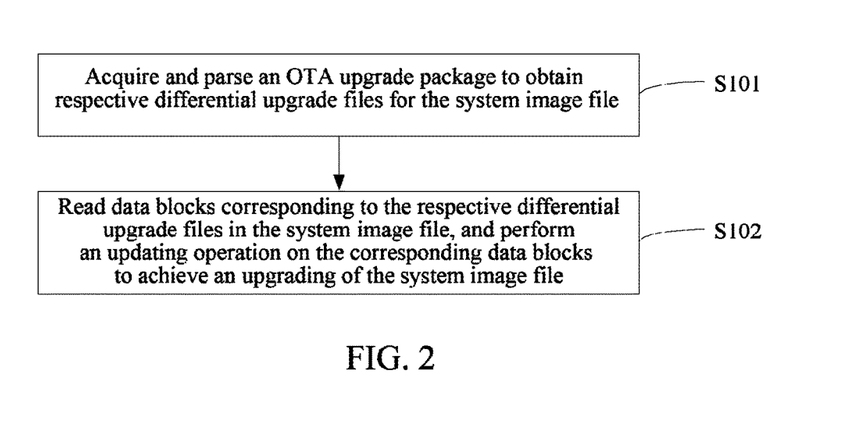
FIG. 2 is a flow chart of an OTA upgrading method provided in an embodiment of the present disclosure.

An embodiment of the present disclosure provides a method for OTA upgrading. In the method, a system image file of a terminal to be upgraded is saved in a form of data blocks. Specifically, as shown in FIG. 2, the method includes steps S201-S202.

In step S201, it is to acquire and parse an OTA upgrade package to obtain respective differential upgrade files for the system image file.

Herein, a file header of a differential upgrade file includes at least an Offset field for indicating an offset of a data block corresponding to the differential upgrade file in the system image file and a Size field for indicating a size of the data block.

In an exemplary embodiment, the file header of the differential upgrade file also includes a magic string field for judging whether the differential upgrade file is valid.

At this time, when the respective differential upgrade files for the system image file are obtained, further, validities of the respective differential upgrade files need to be checked according to the magic string fields of the respective differential upgrade files, and when the respective differential upgrade files are valid, step S202 is triggered.

In step S202, it is to read data blocks corresponding to the respective differential upgrade files in the system image file, and perform an updating operation on the corresponding data blocks to achieve an upgrading of the system image file.

Herein, reading the data blocks corresponding to the respective differential upgrade files in the system image file specifically includes:

it is to read the data blocks corresponding to the respective differential upgrade files in the system image file according to Offset fields and Size fields in the file headers of the respective differential upgrade files.

Furthermore, the upgrading operation on the corresponding data blocks is preferably carried out as follows:

(1) Data blocks corresponding to the respective differential upgrade files are read into a memory;

(2) For the respective data blocks in the memory, patches of the respective differential upgrade files are applied to the corresponding data block;

(3) The upgraded data blocks are written into the terminal device to be upgraded to achieve the upgrading of the system image file.

In that way, the data blocks can be read into the memory for upgrading. In the way, even if the terminal is suddenly powered off or crashes, the unfinished upgrading operation in the memory can be completed as long as the terminal is restarted, thus ensuring the continuity of the upgrading.

Furthermore, the method according to the embodiment of the present disclosure may also use a multi-threading mode to complete a concurrent upgrading of the whole system image, specifically including the following operations.

It is to call a system function to create a processing process for each differential upgrade file, and each processing process calls a corresponding differential upgrade file, and reads a data block corresponding to the differential upgrade file in the system image file to perform the upgrading operation, to achieve a concurrent upgrading of the data blocks to be upgraded.

In summary, the method of the present embodiment uses the split system image files rather than files in the file system as data for differential comparison, so that metadata of the file system are also included in the differential data packet, and the upgrading process does not modify the metadata of the file system, and after the upgrading, the image in the terminal is completely consistent with the image in the production process and does not conflict with the system check mechanism, which achieves the effective combination of the OTA upgrading mechanism with the system image check mechanism.

Figure 3:
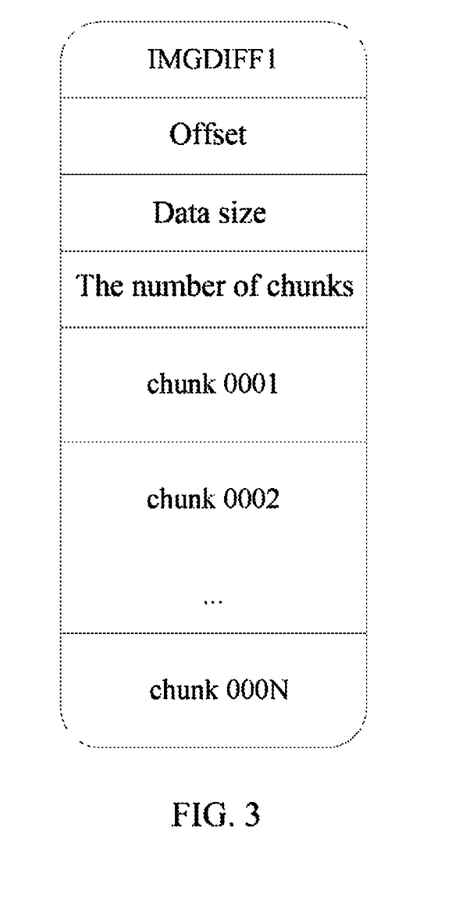
FIG. 3 is a block diagram of a differential upgrade file in an OTA upgrade package in accordance with an embodiment of the present disclosure.
Figure 4:
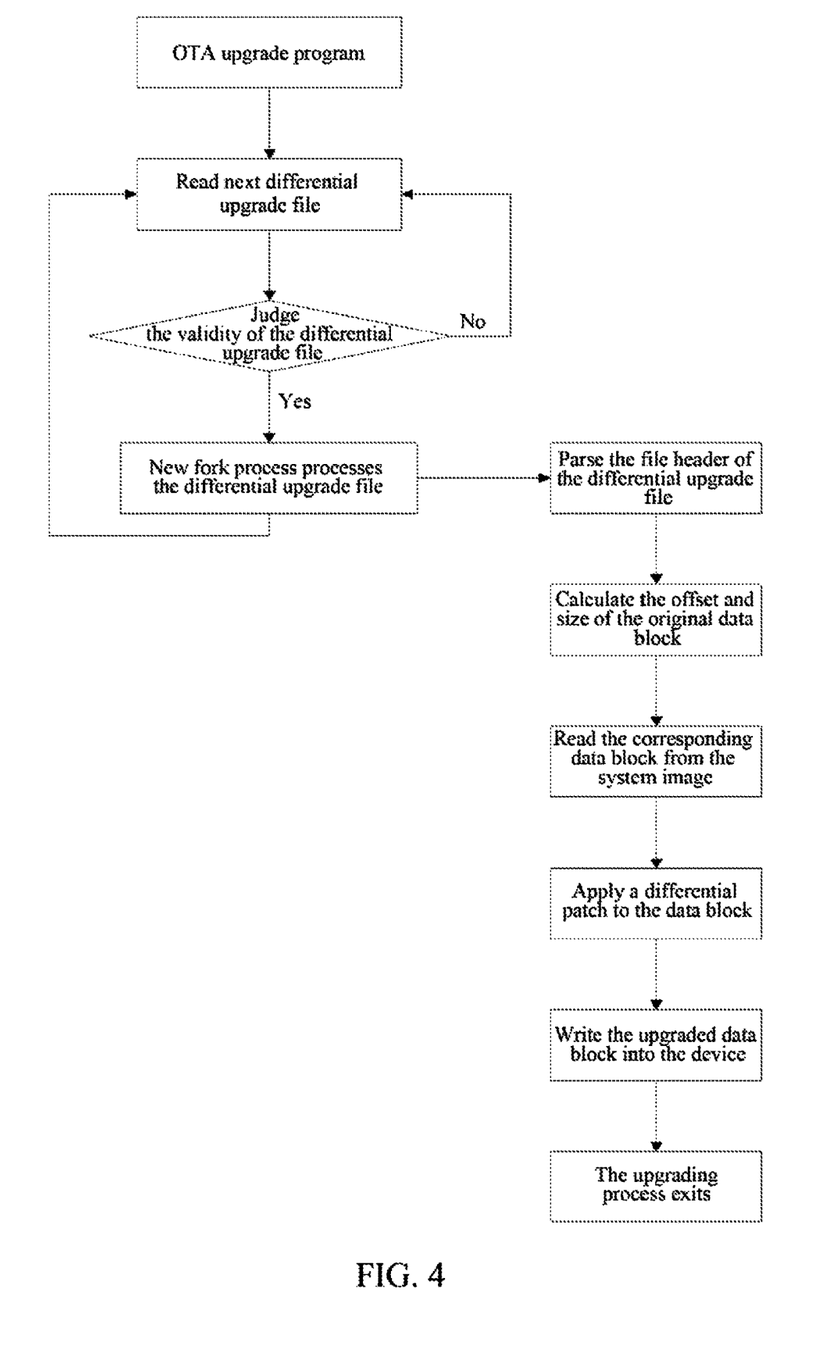
FIG. 4 is another flow chart of the OTA upgrading method provided in an embodiment of the present disclosure.
Figure 5:
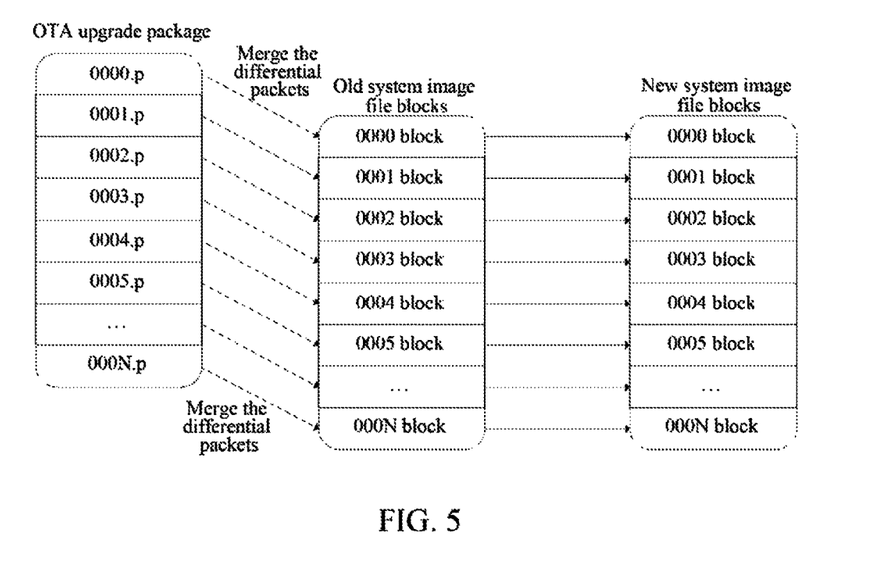
FIG. 5 is a schematic diagram of an OTA upgrading mechanism in accordance with an embodiment of the present disclosure.

To clarify the present disclosure more clearly, an alternative embodiment of the present disclosure will be provided with reference to FIG. 3 to FIG. 5. The technical details of the present disclosure will be further provided in conjunction with the description of the embodiments, so that the specific implementation of the method provided by the present disclosure can be illustrated better.

In the embodiment of the present disclosure, the OTA upgrade package includes all the differential upgrade files for the system image. These differential upgrade files are for the block device and are in unit of fixed-size data block.

Specifically, the OTA upgrade package contains a patch/system/directory, and the directory contains all the differential upgrade files of the system image, and each differential upgrade file corresponds to a segment of separate data block in the system image. During the upgrading process, the upgrade program running in the terminal system first parses each separate differential upgrade file in the upgrade package.

The file header of each differential upgrade file records the offset of the original data corresponding to the differential upgrade file in the system image and the size of the data block. As shown in FIG. 3, the FIG. 3 shows a structure of the file header of the differential upgrade file.

The specific explanation of each field in the file header of the differential upgrade file is as follows:

IMGDIFF1 field: the field is a magic string defined by the Android system and is used to determine the validity of the differential upgrade file.

Offset field: the Offset field is a field newly added by the present disclosure, and the field records the offset of the original data block corresponding to the differential upgrade file in the system image.

For example, supposed the size of each data block is 8M, then:

the starting offset of the first data block is 8M*0=0M;
the starting offset of the second block is 8M*(2−1)=8M;
the starting offset of the third block is 8M*(3−1)=16M;
the starting offset of the $N^{th}$ block is 8M*(N−1).

Size field: the Size field is a field newly added by the present disclosure, and the field records the size of the original data block. The value of the field is filled during the OTA upgrade package production process.

Chunk count: the chunk count is defined by the Android system, and used to determine the number of specific differential data chunk.

Based on the abovementioned description of the OTA upgrade package, a specific process of the OTA upgrading will be described according to the embodiment of the present disclosure as follows. As shown in FIG. 4, the following steps 1-7 are included.

In step 1, the OTA upgrade program running on the terminal first reads each differential upgrade file in the upgrade package in turn.

In step 2, for each differential upgrade file, the OTA upgrade program first checks its validity.

In step 3, if the differential upgrade file is valid, the OTA upgrade program creates a process by the fork system call in Linux; herein the process is set to process the differential upgrade file, and then the OTA upgrade program attempts to read the next differential upgrade file.

In step 4, for each differential upgrade file processing process, it first parses the file header of the differential upgrade file, from which the offset field and size field of the data block corresponding to the differential upgrade file are parsed.

In step 5, the processing process reads the corresponding data block in the system image and save the data block to a memory according to the offset field and size field in the step 4.

In step 6, for the data block in the memory, the processing process applies a differential patch to the data block.

In step 7, after the upgraded data block is written into the terminal physical device, the process exits.

The abovementioned upgrading mechanism is to apply all the differential upgrade files to data blocks corresponding to the old system image to achieve the effect of upgrading the entire system image, as shown in FIG. 5. In addition, the entire system upgrading process is a concurrent operation for the system image, and the entire system will be upgraded to the new target state after all the upgrading processes are completed.

Second Embodiment

Figure 6:
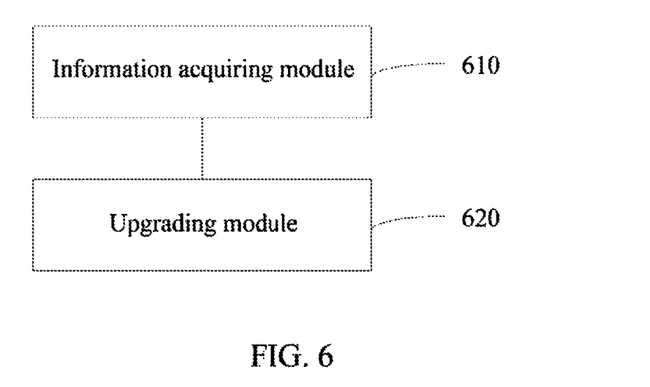
FIG. 6 is a block diagram of a terminal for OTA upgrading in accordance with an embodiment of the present disclosure.

The embodiment of the present disclosure provides a terminal for OAT upgrading, in which the system image file is saved in a form of data blocks. As shown in FIG. 6, the terminal specifically includes an information acquiring module 610 and an upgrading module 620.

The information acquiring module 610 is arranged to acquire and parse an OTA upgrade package to obtain respective differential upgrade files for the system image file.

The upgrading module 620 is arranged to read data blocks corresponding to the respective differential update files in the system image file and perform an upgrading operation on the corresponding data blocks to achieve an upgrading of the system image file.

Herein, a file header of a differential upgrade file includes an Offset field for indicating an offset of a data block corresponding to the differential upgrade file in the system image file, and a Size field for indicating the size of a data block.

The upgrading module 620 is arranged to read data blocks corresponding to the respective differential upgrade files in the system image file according to the Offset fields and the Size fields in the file headers of the respective differential upgrade files.

Furthermore, the file header of a differential upgrade file further includes a magic string field for judging whether the differential upgrade file is valid.

At this time, the information acquiring module 610 is further arranged to check validities of the respective differential upgrade files according to the magic string fields of the respective differential upgrade files when the respective differential upgrade files for the system image file are obtained, and trigger the upgrading module 620 when the respective differential upgrade files are valid.

Furthermore, the present disclosure further provides an alternative upgrading method, specifically:

the upgrading module 620 is arranged to read data blocks corresponding to the respective differential upgrade files into a memory, and for respective data blocks in the memory, apply patches of the respective differential upgrade files to the respective data blocks, and write the upgraded data blocks into the terminal device to achieve the upgrading of the system image file.

The alternative embodiment reads the data blocks into the memory to upgrade, and in that way, even if the terminal is powered down or crashes, as long as the terminal is restarted, the unfinished upgrade operation in the memory can be complete continuously, to ensure the continuity of the upgrading.

Furthermore, the embodiment of the present disclosure may also use the multi-threading mode to complete a concurrent upgrading for the whole system image, specifically is embodied as follows.

The upgrading module 620 is further arranged to call a system function to create a processing process for each differential upgrade file, call a corresponding differential upgrade file by each processing process, read the data block corresponding to the corresponding differential upgrade file in the system image file to perform the upgrading operation, to achieve a concurrent upgrading of the data blocks to be upgraded.

As described above, the terminal in the present embodiment uses the split system image files rather than files in the file system as data for differential comparison, so that metadata of the file system are also included in the differential data packet, and the upgrading process does not modify the metadata of the file system, and after the upgrading, the image in the terminal is completely consistent with the image in the production process and does not conflict with the system check mechanism. Therefore, an effective combination of the OTA upgrading mechanism with the system image check mechanism is achieved through the terminal in the present embodiment.

It will be apparent to those skilled in the art that various changes and modifications of the present disclosure can be made without departing from the essence and scope of the present disclosure. Thus, if the changes and modifications of the present disclosure belong to the appended claims of the present disclosure and their equivalents, such changes and modifications are construed to be included in the present disclosure.

INDUSTRIAL APPLICABILITY

As described above, the method and terminal for OTA upgrading provided in the embodiment of the present disclosure have the following beneficial effects. Split system image files rather than files in the file system are used as data for differential comparison, so that the metadata of the file system is also included in the differential data packet, and the upgrading process does not modify the metadata of the file system, and after the upgrading, the image in the terminal is completely consistent with the image in the production process and does not conflict with the system check mechanism. Therefore, an effective combination of the OTA upgrading mechanism with the system image check mechanism is achieved through the method and terminal for OTA upgrading provided in the embodiment of the present disclosure. In addition, a concurrent upgrading of the system image can be achieved by using the OTA upgrading, which significantly improves the upgrading efficiency.

What is claimed is:

1. A method for over-the-air (OTA) upgrading, in which a system mirror image file of a terminal to be upgraded is saved in a form of data blocks, and the method comprising:

acquiring and parsing an OTA upgrade package to obtain respective differential upgrade files for the system mirror image file;

reading data blocks corresponding to the respective differential upgrade files in the system-mirror image file, and performing an upgrading operation on the corresponding data blocks to achieve an upgrading of the system mirror image file, wherein split system mirror image files rather than files in a file system are used as data for differential comparison to obtain the respective differential upgrade files, the upgrading of the system mirror image file does not modify metadata of the file system and does not conflict with system image check mechanism of the terminal, wherein, a file header of a differential upgrade file includes an Offset field for indicating an offset of a data block corresponding to the differential upgrade file in the system mirror image file, as well as a Size field for indicating a size of the data block; and wherein said reading data blocks corresponding to the respective differential upgrade files in the system mirror image file specifically comprises:

reading the data blocks corresponding to the respective differential upgrade files in the system mirror image file according to Offset fields and Size fields in file headers of the respective differential upgrade files.

2. The method of claim 1, wherein, the file header of a differential upgrade file further comprises a magic string field for judging whether the differential upgrade file is valid; and the method further comprises: checking validities of the respective differential upgrade files according to magic string fields of the respective differential upgrade files when the respective differential upgrade files for the system mirror image file are obtained, and triggering an operation of reading the corresponding data blocks when the respective differential upgrade files are valid.

3. The method of claim 1, wherein, said performing an upgrading operation on the corresponding data blocks to achieve an upgrading of the system mirror image file comprises:
reading the data blocks corresponding to the respective differential upgrade files into a memory;
for the respective data blocks in the memory, applying patches of the respective differential upgrade files to the corresponding data blocks;
writing the upgraded data blocks into the terminal device to be upgraded to achieve the upgrading of the system mirror image file.

4. The method of claim 1, wherein, said reading data blocks corresponding to the respective differential upgrade files in the system mirror image file and performing an upgrading operation on the corresponding data blocks comprises:
calling a system function to create respectively a processing process for each differential upgrade file, and each processing process calling a corresponding differential upgrade file, and reading a data block corresponding to the differential upgrade file in the system mirror image file to perform an upgrading operation, to achieve a concurrent upgrading of the respective data blocks to be upgraded.

5. A terminal for over-the-air (OTA) upgrading, in which a system mirror image file is saved in a form of data blocks, and the terminal comprising a processor and a storage device, wherein the storage device stores processor-executable programs, and the programs comprise:
an information acquiring module, arranged to acquire and parse an OTA upgrade package to obtain respective differential upgrade files for the system mirror image file;
an upgrading module, arranged to read data blocks corresponding to the respective differential updating files in the system mirror image file and perform an upgrading operation on the corresponding data blocks to achieve an upgrading of the system mirror image file, wherein split system mirror image files rather than files in a file system are used as data for differential comparison to obtain the respective differential upgrade files, the upgrading of the system mirror image file does not modify metadata of the file system and does not conflict with system image check mechanism of the terminal,
wherein, a file header of a differential upgrade file comprises an Offset field for indicating an offset of a data block corresponding to the differential upgrade file in the system mirror image file, and a Size field for indicating a size of the data block; and
wherein the upgrading module is arranged to read the data blocks corresponding to the respective differential upgrade files in the system mirror image file according to Offset fields and Size fields in file headers of the respective differential upgrade files.

6. The terminal of claim 5, wherein, the file header of a differential upgrade file further comprises a magic string field for judging whether the differential upgrade file is valid;
the information acquiring module is further arranged to check validities of the respective differential upgrade files according to magic string fields of the respective differential upgrade files when obtaining the respective differential upgrade files for the system mirror image file, and trigger the upgrading module when the respective differential upgrade files are valid.

7. The terminal of claim 5, wherein, the upgrading module is arranged to read the data blocks corresponding to the respective differential upgrade files into a memory, and for the respective data blocks in the memory, apply patches of the respective differential upgrade files to the corresponding data blocks, and write the upgraded data blocks into the terminal device to achieve the upgrading of the system mirror image file.

8. The terminal of claim 5, wherein, the upgrading module is further arranged to call a system function to create respectively a processing process for each differential upgrade file, and use each processing process to call a corresponding differential upgrade file, and read a data block corresponding to the corresponding differential upgrade file in the system mirror image file to perform an upgrading operation, to achieve a concurrent upgrading of the respective data blocks to be upgraded.

9. The method of claim 2, wherein, said reading data blocks corresponding to the respective differential upgrade files in the system mirror image file and performing an upgrading operation on the corresponding data blocks comprises:
calling a system function to create respectively a processing process for each differential upgrade file, and each processing process calling a corresponding differential upgrade file, and reading a data block corresponding to the differential upgrade file in the system mirror image file to perform an upgrading operation, to achieve a concurrent upgrading of the respective data blocks to be upgraded.

10. The method of claim 3, wherein, said reading data blocks corresponding to the respective differential upgrade files in the system mirror image file and performing an upgrading operation on the corresponding data blocks comprises:
calling a system function to create respectively a processing process for each differential upgrade file, and each processing process calling a corresponding differential upgrade file, and reading a data block corresponding to the differential upgrade file in the system mirror image file to perform an upgrading operation, to achieve a concurrent upgrading of the respective data blocks to be upgraded.

11. The terminal of claim 6, wherein, the upgrading module is further arranged to call a system function to create respectively a processing process for each differential upgrade file, and use each processing process to call a corresponding differential upgrade file, and read a data block corresponding to the corresponding differential upgrade file in the system mirror image file to perform an upgrading operation, to achieve a concurrent upgrading of the respective data blocks to be upgraded.

12. The terminal of claim 7, wherein, the upgrading module is further arranged to call a system function to create respectively a processing process for each differential upgrade file, and use each processing process to call a corresponding differential upgrade file, and read a data block corresponding to the corresponding differential upgrade file in the system mirror image file to perform an upgrading operation, to achieve a concurrent upgrading of the respective data blocks to be upgraded.

* * * * *